US012688997B2

(12) United States Patent
Franssen

(10) Patent No.: US 12,688,997 B2
(45) Date of Patent: Jul. 21, 2026

(54) MICROWAVE SYNCHRONISATION SYSTEM

(71) Applicant: DOCTOR X WORKS BV (NL/NL), Eindhoven (NL)

(72) Inventor: Jim Gerardus Hubertus Franssen, Thorn (NL)

(73) Assignee: DOCTOR X WORKS BV (NL/NL), Eindhoven (NL)

( * ) Notice: Subject to any disclaimer, the term of this patent is extended or adjusted under 35 U.S.C. 154(b) by 104 days.

(21) Appl. No.: 18/865,609

(22) PCT Filed: May 10, 2023

(86) PCT No.: PCT/EP2023/062440
§ 371 (c)(1),
(2) Date: Nov. 13, 2024

(87) PCT Pub. No.: WO2023/217872
PCT Pub. Date: Nov. 16, 2023

(65) Prior Publication Data
US 2025/0266235 A1    Aug. 21, 2025

(30) Foreign Application Priority Data
May 13, 2022    (GB) ..................................... 2207037

(51) Int. Cl.
*H01J 37/26*        (2006.01)
*H01J 37/04*        (2006.01)

(52) U.S. Cl.
CPC ............ *H01J 37/265* (2013.01); *H01J 37/04* (2013.01); *H01J 37/26* (2013.01); *H01J 2237/26* (2013.01)

(58) Field of Classification Search
CPC ............ H01J 37/26; H01J 2237/06333; H01J 2237/26; H01J 37/04; H01J 37/3299;
(Continued)

(56) References Cited

U.S. PATENT DOCUMENTS 7,397,567 B2    7/2008    Kaertner et al.
7,708,135 B2    5/2010    Ellerth et al.
(Continued)

FOREIGN PATENT DOCUMENTS

CN        104348070 B    1/2018
KR        20130090544 A    8/2013
KR        20190045048 A    5/2019

OTHER PUBLICATIONS

Otto, Martin R., et al. "Solving the jitter problem in microwave compressed ultrafast electron diffraction instruments: Robust sub-50 fs cavity-laser phase stabilization." Structural Dynamics 4.5 (2017). (Year: 2017).*
(Continued)

*Primary Examiner* — Ryan Johnson
(74) *Attorney, Agent, or Firm* — Michael Best & Friedrich LLP

(57) ABSTRACT

A microwave synchronisation system comprising an oscillator configured to provide a microwave signal, and an RF cavity configured to resonantly enhance the microwave signal to form a resonantly enhanced electromagnetic field, an electro-optic modulator connected to the RF cavity and configured to receive a microwave signal from the RF cavity, and an optical interferometer which includes the electro-optic modulator and is configured to provide an output indicative of a phase difference between a pulsed laser beam and the microwave signal received from the RF cavity, wherein the output from the interferometer is connected to an input of the oscillator to provide feedback through which electromagnetic fields in the RF cavity can be synchronised with the pulsed laser beam.

15 Claims, 5 Drawing Sheets

(58) Field of Classification Search
CPC ..... G02F 1/0123; H01S 3/1106; H03B 17/00; H03B 2200/0044; H03B 5/1817; H03B 9/12; H03L 7/00
See application file for complete search history.

(56) References Cited

U.S. PATENT DOCUMENTS

| | | | |
|---|---|---|---|
| 9,169,083 | B2 | 10/2015 | Huff et al. |
| 2008/0024787 | A1 | 1/2008 | Kaertner et al. |
| 2020/0035442 | A1* | 1/2020 | Otto ....................... H03B 17/00 |

OTHER PUBLICATIONS

Chatelain, Robert P., et al. "Ultrafast electron diffraction with radio-frequency compressed electron pulses." Applied Physics Letters 101.8 (2012). (Year: 2012).*

Brussaard, G. J. H., et al. "Direct measurement of synchronization between femtosecond laser pulses and a 3 GHz radio frequency electric field inside a resonant cavity." Applied Physics Letters 103.14 (2013). (Year: 2013).*

Yang, Heewon, et al. "10-fs-level synchronization of photocathode laser with RF-oscillator for ultrafast electron and X-ray sources." Scientific Reports 7.1 (2017): 39966. (Year: 2017).*

United Kingdom Search Report for Application No. 2207037.9 dated Sep. 30, 2022 (1 page).

International Search Report and Written Opinion for Application No. PCT/EP2023/062440 dated Jul. 28, 2023 (13 page).

Peng et al., "Balanced optical-microwave phase detector for sub-femtosecond optical-RF synchronization", Optics Express, vol. 22, No. 22, Oct. 23, 2014 (Oct. 23, 2014), p. 27102, XP055669546, DOI: 10.1364/OE.22.027102, the whole document (10 pages).

Pasmans et al., "Microwave TM010 cavities as versatile 4D electron optical elements", Ultramicroscopy, vol. 127, Apr. 1, 2013 (Apr. 1, 2013), pp. 19-24, XP055374306, NL ISSN: 0304-3991, DOI: 10.1016/j.ultramic.2012.07.011, the whole document (6 pages).

Hosseini et al., "Low-Drift Optoelectronic Oscillator Based on a Phase Modulator in a Sagnac Loop", IEEE Transactions on Micro-wave Theory and Techniques, IEEE, USA, vol. 65, No. 7, Jul. 1, 2017 (Jul. 1, 2017), pp. 2617-2624, XP011655052, ISSN: 0018-9480, DOI: 10.1109/TMTT.2016.2640286, the whole document (8 pages).

Lassise, A. et al. "Compact, low power radio frequency cavity for femtosecond electron microscopy. Review of Scientific Instruments", 83(4), 1-10. Article 043705, published Jan. 1, 2012, DOI: https://doi.org/10.1063/1.3703314, (12 pages).

Otto et al., Solving the jitter problem in microwave compressed ultrafast electron diffraction instruments: Robust sub-50 fs cavity-laser phase stabilization: Structural Dynamics 4, 051101, dated Sep. 1, 2017; doi: 10.1063/1.4989960 <http://aca.scitation.org/toc/sdy/4/5 American Institute of Physics> (8 pages).

Jung et al., "Subfemtosecond synchronization of microwave oscil-lators with mode-locked Er-fiber lasers," Opt. Lett. 37, p. 2958-2960, dated Jul. 13, 2012 (4 pages).

Chan-Gi Jeon, Yongjin Na, Bong-Wan Lee, and Jungwon Kim, "Simple-structured, subfemtosecond-resolution optical-microwave phase detector," Opt. Lett. 43, p. 3997-4000, dated Aug. 14, 2018 (6 pages).

Dennis et al. "Inherently bias drift free amplitude modulator." Electronics Letters 32 (1996): p. 547-548, dated Mar. 14, 1996 (3 pages).

Kim et al., "Balanced optical-microwave phase detectors for optoelectronic phase-locked loops," Opt. Lett. 31, 3659-3661, dated Nov. 22, 2006 (12 pages).

Kim et al., Attosecond-precision ultrafast photonics. Laser & Pho-ton. Rev., 4: p. 432-456, dated Apr. 23, 2010 (25 pages).

* cited by examiner

MICROWAVE SYNCHRONISATION SYSTEM

CROSS-REFERENCE TO RELATED APPLICATIONS

This application is a U.S. National Phase of International Application No. PCT/EP2023/062440, filed on May 10, 2023, which claims priority to Great Britain Patent Application No. 2207037.9, filed on May 13, 2022, both of which are hereby incorporated by reference in their entireties.

FIELD

The present invention relates to a microwave system, in particular a system configured to synchronise resonantly enhanced electromagnetic (EM) fields in an RF cavity with laser pulses.

BACKGROUND

Microwave synchronisation systems, in particular systems which synchronise microwaves with laser pulses are used to study fast dynamics at the atomic length scale. Ultrafast electron techniques have been developed that enable the investigation of the dynamics of structural changes with both atomic spatial and temporal resolution, i.e. 1 nm and 100 fs resolution. These ultrafast electron techniques, which utilise synchronisation of microwaves with laser pulses, are referred to as ultrafast electron microscopy (UEM) and ultrafast electron diffraction (UED).

In one example, UEM has been used to image the evolution in real time of photo-excited phonons. In another example, UED has been used to investigate the dynamics of e.g. phase transitions and electronic state changes. These ultrafast pump-probe techniques use an ultrashort laser (pump) pulse to initiate the dynamical process, after which the structure of the sample is probed using an ultrashort electron pulse. The dynamics can be retrieved by probing the structure of the sample for various delays between the pump (laser) and probe (electron) pulses.

In order to avoid losing information, the electron pulse length used by a pump-probe technique should be shorter than the shortest timescale associated with the dynamical process under investigation. This means that in many cases the electron pulse length should preferably be much shorter than one picosecond. This can be achieved by compressing longer electron pulses using a resonant RF cavity operated in the TM010 mode (as explained in P. L. E. M. Pasmans et al, Microwave TM010 cavities as versatile 4D electron optical elements, Ultramicroscopy, Volume 127, April 2013, Pages 19-24). This mode has an on-axis electric field that can be used to accelerate or decelerate electrons depending on their exact arrival time. To compress an electron pulse the electromagnetic (EM) fields in the RF cavity accelerate the electrons in the back of a pulse while slowing down the electrons in the front of the pulse. This causes the electron pulse to compress in time and hence increases the temporal resolution in UED and UEM. In this document the term RF cavity refers to a resonant microwave cavity.

In most cases, electron pulses are created by femtosecond photoemission of a cathode material. This means that the electron pulses are intrinsically synchronized to the laser pulses used to create them. The laser pulses used to pump a sample may be derived from the same laser source as used for the photoemission. The laser pulses used to pump the sample are therefore intrinsically synchronized to the electron pulses. When an RF cavity is used to compress the electron pulses the EM field in the RF cavity must be synchronized with the electron pulses. In practice this means that the EM field in the RF cavity can be synchronized with the laser pulses, since the laser pulses are intrinsically synchronized with the electron pulses.

In an alternative approach, instead of generating a pulsed electron beam using femtosecond photoemission, electron pulses can be created by chopping a continuous electron beam, using a slit in combination with a RF cavity operated in TM110 mode (see A. Lassise et al, 2012, Review of Scientific Instruments, Vol. 83, Issue 4, 2012. This mode has an oscillating magnetic field perpendicular to the direction of motion of the electron beam. This causes the continuous electron beam to be swept across a slit or pinhole.

The pulses that are created in this way pass the pinhole only at a specific phase of EM fields in the RF cavity, which means that the electron pulses are intrinsically synchronized to the phase of the EM fields in the cavity. To enable pump-probe experiments with a chopped beam, the phase of the EM fields inside the chopping cavity must thus be synchronized to the laser pulses that are used to pump the sample. This is the other way around compared to when the electron pulses are generated by photoemission (where they are intrinsically synchronized to the laser pulses) and a RF compression cavity is used to compress the electron pulses. In most cases RF compression of chopped pulses is still necessary to achieve sufficient temporal resolution. This means that both the chopping and the compression cavity need to be synchronized with the laser pulses and consequently to each other.

When the phase of the EM fields in the RF cavity and the electron pulses are not synchronized in the case of a compression cavity, the electron pulse is either accelerated or decelerated in its entirety resulting in earlier or later arrival at the position of the sample and thus spoiling of the temporal resolution. Since the electrons are derived from the laser pulses (in the case of photoemission) the phase of the EM fields in the RF compression cavity must thus be synchronized to the laser pulses. In the case of the chopped electron pulses the laser must be synchronized to the EM fields in both the chopping RF cavity and the compression RF cavity.

Drift in the synchronization between the laser pulses and the EM fields in the RF (compression or deflection) cavity currently limits the resolution of ultrafast pump-probe experiments. Drift may be thought of as a timing variation between the laser pulses and the EM fields in the RF cavity averaged over many RF cycles. Drift may for example be caused by environmental changes such as temperature and humidity. Drift generally limits the temporal resolution of measurements series to 50 fs.

It may be desirable to provide a microwave synchronisation system which reduces drift between laser pulses and EM fields in an RF cavity, in a way which is not disclosed by the prior art.

SUMMARY

According to a first aspect of the invention there is provided a microwave synchronisation system comprising:
    an oscillator configured to provide a microwave signal, and an RF cavity configured to resonantly enhance the microwave signal to form a resonantly enhanced electromagnetic field, an electro-optic modulator connected to the RF cavity and configured to receive a microwave signal from the RF cavity, and an optical interferometer which includes the electro-optic modulator and is configured to provide an output indicative of a phase difference between a pulsed laser beam and the microwave signal received from the RF cavity, wherein the output from the interferometer is connected to an input of the oscillator to provide feedback through which electromagnetic fields in the RF cavity can be synchronised with the pulsed laser beam.

The invention may advantageously provide improved synchronisation, because the phase difference between the laser pulses and the EM fields in the RF cavity is encoded into an optical signal by the electro-optic modulator. This is advantageous because once the signal has been converted into the optical domain it is less prone to noise (this is because the frequencies of the optical signals are in the range of a few hundred THz). Some prior art systems may synchronise an RF oscillator to a pulsed laser beam, and then use an RF signal output from the RF oscillator to drive an RF cavity. However, in such systems noise and/or drift may be introduced into the signal that is sent from the output of the RF oscillator towards the RF cavity and which may pass various RF components on the way (e.g. due to temperature variations). In addition, properties of the RF cavity may change (e.g. due to temperature variations), thereby modifying the EM fields in the RF cavity. In both cases, there is a reduction of the accuracy of synchronisation between the EM fields in the RF cavity and the pulsed laser beam. Embodiments of the invention avoid this reduction of accuracy by synchronising the EM fields in the RF cavity with the pulsed laser beam.

The electro-optic modulator may be connected to the RF cavity by a microwave waveguide which opens into the RF cavity.

The electro-optic modulator may be provided in or adjacent to the microwave waveguide.

A termination may be provided at an end of the microwave waveguide which is opposite to the RF cavity.

Optical fibres may be connected at opposite ends of the electro-optic modulator, and wherein the optical fibres pass through openings provided in a body of the RF cavity.

The electro-optic modulator may be connected to the RF cavity by a cable.

The cable may have a length of up to 50 cm

The microwave synchronisation system may further comprise insulting material provided around at least part of the cable.

The optical interferometer may be a fibre-Sagnac loop.

The fibre-Sagnac loop may include a quarter-wave bias.

The microwave synchronisation system may further comprise a pulsed laser. An optical delay stage may be located between the laser and an input of the optical interferometer.

A microwave synchronization comprising a pulsed laser and further comprising at least two systems according to claim 1, wherein each system includes optics configured to direct a pulsed laser beam from the pulsed laser to the at least two systems, and wherein each of the systems is configured to synchronise a resonantly enhanced electromagnetic field in that system to the pulsed laser beam.

According to a second aspect of the invention, there is provided a method of synchronising a resonantly enhanced electromagnetic field in an RF cavity with respect to a pulsed laser beam, the method comprising using an oscillator to generate a microwave signal which is amplified then resonantly enhanced by an RF cavity to form a standing wave, directing a microwave signal from the RF cavity to an electro-optic modulator, using an optical interferometer which includes the electro-optic modulator to determine a phase difference between the pulsed laser beam and the microwave signal received from the RF cavity, and using an output from the interferometer to control operation of the oscillator and thereby synchronise the resonantly enhanced electromagnetic field in the RF cavity with respect to the pulsed laser beam.

The invention may advantageously provide improved synchronisation.

The RF signal may be directed from the RF cavity to the electro-optic modulator by a microwave waveguide.

The RF signal may be directed from the RF cavity to the electro-optic modulator by a cable.

Features of different aspects of the invention may be combined together.

BRIEF DESCRIPTION OF THE DRAWINGS

Embodiments of the invention will now be described, by way of example only, with reference to the accompanying schematic drawings, in which.

DETAILED DESCRIPTION

Figure 1:
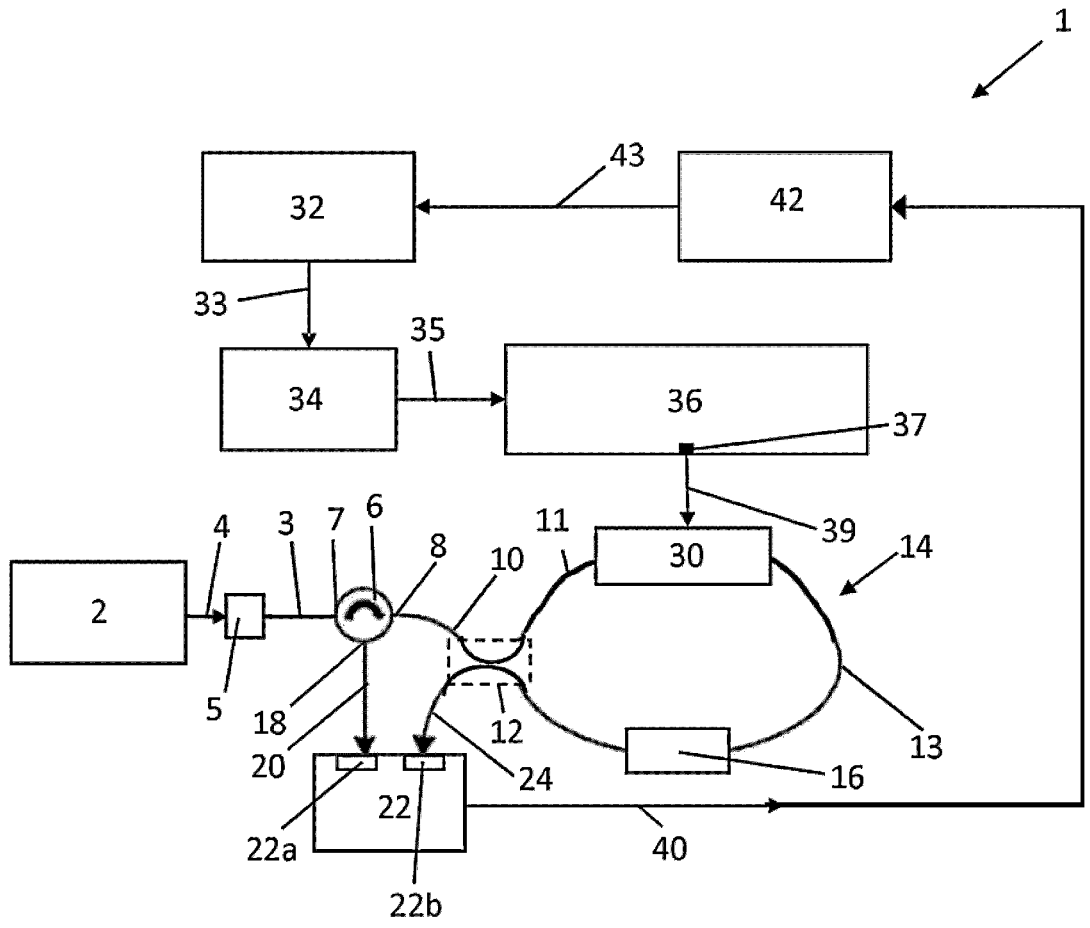
FIG. 1 schematically depicts a microwave synchronisation system according to an embodiment of the invention.

FIG. 1 schematically depicts a microwave system 1 according to an embodiment of the invention. The microwave system comprises a laser 2 configured to emit a pulsed laser beam 4. The pulsed laser beam 4 is linearly polarized. The laser 2 may for example be a mode locked laser capable of emitting pulses having durations of tens of femtoseconds. The laser 2 may for example be a Ti-Sapphire laser or an Er-doped fibre laser. The pulses may for example have a duration of around 50 fs. The pulses may for example be generated at a frequency (repetition rate) of around 75 MHz. The pulses may for example be generated at a frequency which lies between 25 and 250 MHz. The pulses may be generated at a frequency of up to 1 GHz.

The laser 2 may have a free space optical output. Where this is the case, the pulsed laser beam may be coupled into a polarization maintaining (PM) fibre 3 using a fibre collimator 5. The fibre coupled light is then transferred to the optical circulator 6 via the optical fibre 3.

An optical circulator 6 is configured to receive the pulsed laser beam 4 at an input port 7 and couple the pulsed laser beam 2 to a first output port 8. The pulsed laser beam 4 is coupled from the first output port 8 to a second optical fibre 10. The second optical fibre 10 is a polarization maintaining fibre. Other optical fibres of the system may also be polarization maintaining fibres. The second optical fibre 10 is connected via a 2×2 (50:50) optical coupler 12 to a fibre Sagnac loop 14. The 2×2 optical coupler has a conventional construction. It comprises two optical fibres that run adjacent to each other such that waveguide modes of the optical fibres are coupled to each other, causing light to pass from one fibre to the other fibre. The 2×2 (50:50) coupler divides the power of the input (which may be referred to as Pin) light into two, directing half of the laser light around the fibre Sagnac loop 14 in a clockwise direction and directing the other half of the laser light around the fibre Sagnac loop in an anticlockwise direction. The optical coupler 12 may for example be a FOC-12P-111-5/125-PPP-800-50-3A3A3A-1-1, available from Oz Optics, of Ottawa, Canada.

The fibre Sagnac loop includes a quarter-wave bias 16. The quarter-wave bias has a conventional construction and comprises a Faraday rotator, then a quarter wave plate, another Faraday rotator and then a half wave plate. The quarter wave bias is a free space optical element. At both ends of the quarter wave bias there are fibre collimators that couple the light from the fibre to free space and back again. Other configurations of quarter-wave bias may be used. The quarter-wave bias will apply a phase shift of $\pi/4$ to light circulating in the clockwise direction and will apply a phase shift of $-\pi/4$ to light which is circulating in the anticlockwise direction. This provides a combined phase shift between the clockwise and anti-clockwise light of $\pi/2$.

Light which has travelled in the clockwise direction around the fibre Sagnac loop 14 meets light which is has travelled in the anticlockwise direction at the 2×2 optical coupler 12. There is a phase shift of $\pi/2$ between the clockwise light and the anticlockwise light. Interference between the clockwise and the anticlockwise light occurs. When the phase shift is $\pi/2$, the interference causes half of the power of the input light to be coupled out of each arm of the 2×2 coupler. Thus, half of the light passes to the optical circulator 6 (via the second optical fibre 10 and the second port 8). That light then passes out of a third port 18 of the optical circulator 6. An optical fibre 20 carries light from the third port 18 to a first detector 22a of a balanced photodetector 22. Half of the light passes to an optical fibre 24 which carries light to a second detector 22b of the balanced photodetector 22. Since both detectors 22a, 22b receive half of the power of the input light, a difference determined by the balanced photodetector is zero (for a phase difference of $\pi/2$ applied by the quarter wave bias).

The fibre Sagnac loop 14 includes an electro-optic phase modulator 30. The electro-optic phase modulator 30 is described in detail below in connection with FIG. 3. A microwave signal from a RF cavity 36 is applied to the electro-optic modulator 30. The microwave signal causes a modulation of the refractive index of the electro-optic modulator 30. The refractive index modulation is a travelling wave which travels along the electro-optic modulator 30 from left to right in FIG. 1 (this direction corresponds with the clockwise direction). As a result of the travelling refractive index modulation, a phase shift $\Delta\varphi$ is applied to laser light which is travelling in the clockwise direction around the fibre Sagnac loop 14. However, no significant phase shift is applied to laser light which is travelling in the anticlockwise direction. The phase difference of the light which arrives at the 2×2 coupler 12 is no longer $\pi/2$ but instead has a different value, $\pi/2+\Delta\varphi$. The power of laser light output by each arm of the 2×2 coupler is determined according to the phase difference of light arriving at the 2×2 coupler as follows:

$$\text{Power output from one arm} = Pin * Sin(\pi/4 + \Delta\varphi/2)^2 \qquad \text{Equation 1a}$$

$$= (Pin/2) * (1 + Sin(\Delta\varphi))$$

$$\text{Power output from other arm} = Pin * Cos(\pi/4 + \Delta\varphi/2)^2 \qquad \text{Equation 1b}$$

$$= (Pin/2) * (1 - Sin(\Delta\varphi))$$

Thus, when the electro-optic modulator 30 applies a phase shift to the light travelling in the clockwise direction, this will result in different powers of light being received by the first detector 22a and the second detector 22b. The output of the balanced detector is proportional to the difference in power measured by 22a and 22b, which is given by:

$$\text{Output balanced detector} \propto Pin * Sin(\Delta\varphi), \qquad \text{Equation 2}$$

The size, and the sign of the output of the balanced detector, will depend upon the size and sign of the phase shift $\Delta\varphi$ that is applied by the electro-optic modulator.

In other words the phase shift $\Delta\varphi$ applied by the EOM has been converted to an amplitude modulation. The balanced photodetector 22 provides a signal (e.g. voltage) which is proportional to the phase shift that was applied by the electro-optic modulator 30. The latter equation shows that for small phase shifts the output signal of the balanced detector is linear in $\Delta\varphi$. When the laser pulses and the microwaves are synchronized the phase shift is zero and thus the output of the balanced detector is zero.

The microwave system 1 further comprises an RF oscillator 32, an RF amplifier 34, and a resonant microwave cavity 36 (which may be referred to as an RF cavity 36). In this document the term RF may be used to refer to frequencies which are in the microwave domain. Embodiments of the invention may use a frequency of at least 1 GHz. Embodiments of the invention may use a frequency of up to 50 GHZ, e.g. up to 20 GHz. Embodiments of the invention may for example use a frequency of 1 GHz.

The RF oscillator 32 outputs an RF signal which is carried by a coaxial cable 33 to the RF amplifier 34. The RF amplifier 34 amplifies the RF signal, which then passes via a coaxial cable 35 to the RF cavity. Coaxial cables mentioned in this document may have an impedance of 50 Ohms. The RF cavity resonantly enhances the amplified RF signal. As explained further below, pulses of electrons (not depicted) pass through the RF cavity and are manipulated by the resonantly enhanced EM fields in the cavity (e.g. the electron pulses are compressed). The RF cavity 36 is held in a vacuum. This allows the electrons to pass without scattering with a background gas, the mean free path of an electron pulse needs to be much larger than the cavity dimensions.

The RF oscillator 32 may for example be a voltage controlled oscillator (VCO) or a Dielectric Resonator oscillator (DRO), and may be configured to create an RF signal at the resonant frequency of the cavity (e.g. 3 GHZ). The frequency of the RF signal may be controlled by controlling a voltage at an input of the RF oscillator (as is explained further below). The RF oscillator may for example be a Ultra Electronics Herley DRO 3 GHz.

The frequency of the RF signal is a harmonic of the frequency (repetition rate) of the pulsed laser 2. As noted further above, the laser may operate at a frequency of 75 MHz. This is $\frac{1}{40}^{th}$ of the frequency of the 3 GHZ RF signal output by RF oscillator 32. The laser 2 may operate at other frequencies, and the RF signal may have a different frequency. The RF signal should be at a frequency which is resonant in the RF cavity 36.

The RF amplifier 34 may for example be a minicircuits zhl-16 W-43-s+, or a minicircuits ZHL-100 W-63+, available from Mini-Circuits of New York, USA. The RF amplifier 34 is configured to amplify the RF signal from the RF oscillator 32. The coaxial RF cable 35 carries the amplified RF signal from the RF amplifier to the RF cavity 36.

A resonantly enhanced EM field is formed in the RF cavity 36. The RF cavity 36 is configured to resonantly enhance the amplified RF signal (e.g. at 3 GHZ) provided via the coaxial cable 35. The RF cavity may have a Q-factor (quality factor) of at least 1000. In an embodiment in which the RF cavity is a deflection cavity (i.e. configured to deflect an electron beam and thereby chop bunches of electrons), the Q-factor may be greater than 5000. In an embodiment in which the RF cavity is a compression cavity (i.e. configured to compress electron bunches in an electron beam), the Q-factor may be greater than 9000.

The RF cavity 36 may for example form part of a pump-probe measurement system (not depicted).

The RF cavity 36 is connected via an antenna 37 and a cable 39 (e.g. coaxial cable or other type of cable which includes some external shielding) to the electro-optic modulator 30. The antenna 37 is described further below in connection with FIG. 2. The antenna 37 may be connected to the cable 39 by a standard thread antenna (SMA) port or other suitable connector. The cable 39 is sufficiently long to extend from the antenna 37 to outside of a vacuum enclosure of the RF cavity 36. The cable thus may for example be at least 5 cm long. The cable 39 is sufficiently long to extend to the electro-optic modulator 30. The cable 39 thus may for example be at least 10 cm long. The cable 39 may be longer than 10 cm (e.g. up to 50 cm). The cable 39 may introduce an unwanted phase shift into the RF signal passed from the antenna 37 to the electro-optic modulator 30. Thus, it may be desirable to keep the cable 39 as short as possible (e.g. less than 50 cm or less, preferably 30 cm or less). The unwanted phase shift may be caused by changes of temperature of the cable 39. A temperature controlled environment may be provided for the cable 39 in order to reduce unwanted phase shift (e.g. if an undesirably large phase shift were seen and it was not possible to shorten the cable). The temperature controlled environment may for example comprise insulated material around the cable or e.g. a coaxial cable that has an insulator material that minimises the phase shift caused by changes of ambient temperature. The cable 39 may be connected to the electro-optic modulator 30 by an SMA port 71.

Figure 2:
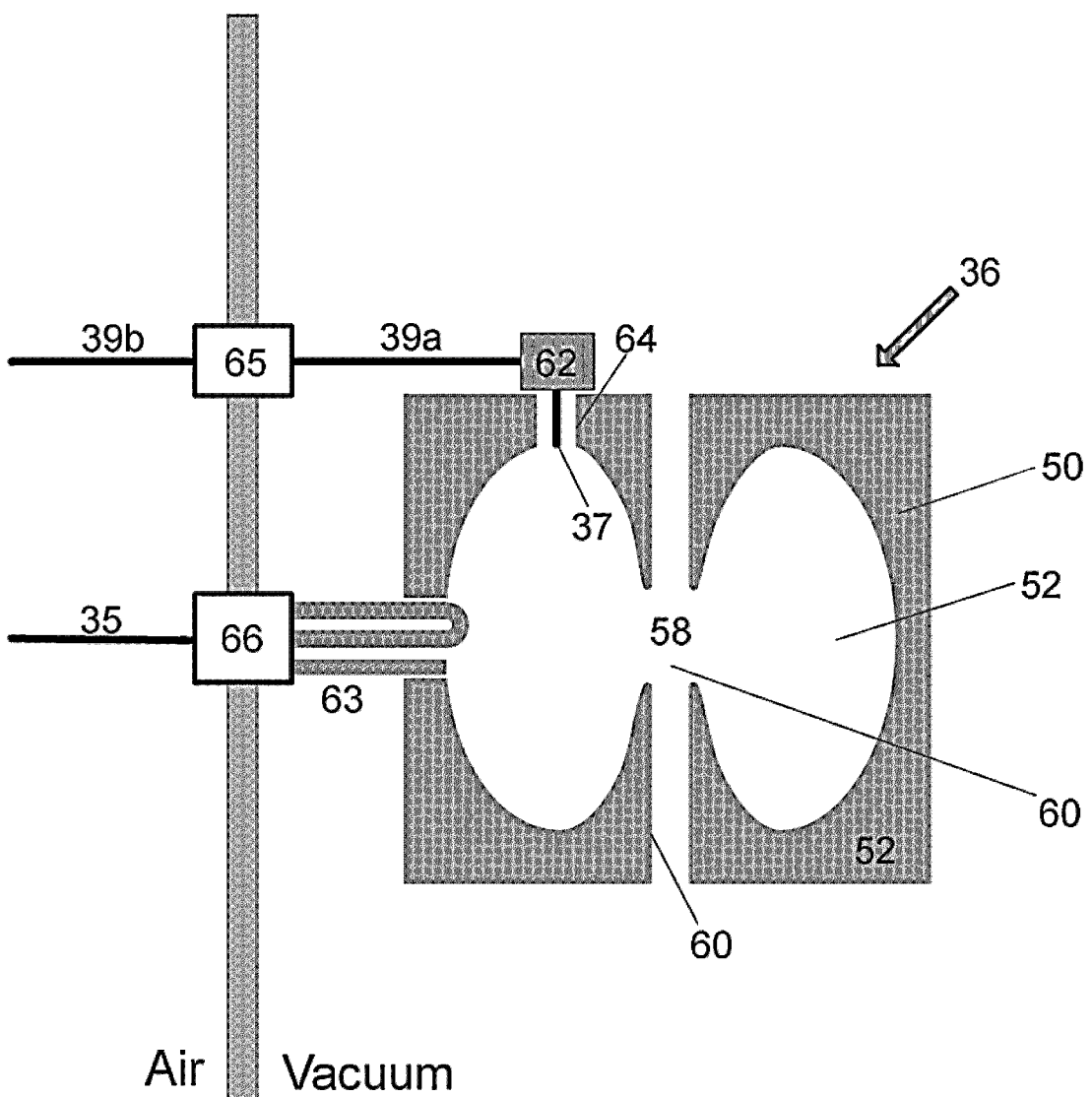
FIG. 2 is a schematic cross-sectional view of an RF cavity of the microwave synchronisation system of FIG. 1.

The cable 39 may be provided in two parts, a first part being inside a vacuum enclosure within which the RF cavity 36 is provided, and a second part being outside of the vacuum enclosure. The first and second parts of the cable may be connected by a high vacuum feed through. This is illustrated in FIG. 2 and described further below.

The EM fields within the RF cavity induce an RF signal at the antenna 37, providing an RF signal which travels along the cable 39 to the electro-optic modulator 30. The RF signal travels along the electro-optic modulator as a travelling wave. This modulates the refractive index of the electro-optic modulator 30. The refractive index modulation of the electro-optic modulator 30 travels from left to right in FIG. 1, and applies a phase shift to laser light which is travelling around the fibre Sagnac loop 14 in the clockwise direction. The size of the phase shift that is applied to the laser light depends upon a phase difference between the laser light and the resonantly enhanced EM fields within the RF cavity 36 (as passed to the electro-optic modulator 30 via the antenna 37 and the cable 39). If the resonantly enhanced EM field and the pulses of the laser light are exactly synchronised then no phase shift is applied to the laser light. If the phase of the resonantly enhanced EM field is ahead or behind the phase of the pulses of the laser light, then a positive or negative phase shift is applied to the laser light accordingly. Additionally, the amount of phase shift depends on the amplitude of the RF signal that is applied to the EOM 30. The applied phase shift should not be larger than $+/-\pi/2$ because beyond these bounds it is not possible to distinguish between for example $\sin(\pi/4)$ and $\sin(3\pi/4)$ which would give an equal output on the balanced detector.

As explained further above, the power of laser light received at the detectors 22a, 22b of the balanced photodetector 22 depends upon the phase difference between the clockwise and anticlockwise light in the fibre Sagnac loop 14. The balanced photodetector 22 provides an output signal 40 which is proportional to the phase difference between the clockwise and anticlockwise light. Due to the quarter wave bias the output signal 40 is thus proportional (see Equation 2) to the phase shift $\Delta\varphi$ applied by the EOM. In turn, the phase shift $\Delta\varphi$ applied by the EOM is proportional to the phase difference between the resonantly enhanced EM fields in the RF cavity 36 and the optical pulses emitted by the laser 2. This thus means that the output of the balanced detector is a direct measure for the phase difference (or timing difference) between the resonantly enhanced EM fields in the RF cavity and the laser pulses emitted by laser 2.

This output signal 40 passes to loop electronics 42. The loop electronics 42 may for example be a proportional-integral-derivative (PID) controller 42. PID controllers are well known and are therefore not described in detail here. An example of a PID controller which may be used is a SIM960, available from Stanford Research Systems of Stanford, USA. An output signal 43 of the PID controller is a DC voltage that controls the frequency of the RF oscillator 32. The PID controller 42 continuously calculates an error value as a difference between a desired set point (which is set to zero) and the signal 40, and applies a correction based on proportional, integral and derivative terms. The PID controller 42 is set such that it seeks to achieve a zero phase difference between the laser pulses and resonantly enhanced EM fields in the RF cavity 36.

The output signal 43 causes the frequency of the RF signal generated by the RF oscillator 32 to be adjusted momentarily in accordance with the phase difference seen by the balanced photodetector 22. The frequency adjustment adjusts the RF signal provided by the RF oscillator such that the EM field in the RF cavity is synchronised with the laser pulses of the laser beam emitted by the laser 2. For example, the phase of the RF signal may change due to an environmental effect on the oscillator 32, RF amplifier 34, RF cavity 36, or the coaxial cables 33, 35 (or other component). This causes a phase difference between the RF signal in the electro-optic modulator 30 and the laser pulses, and generates an output signal 40 from the balanced photodetector 22. The output signal 40 from the balanced photodetector 22 passes via the loop electronics 42 to provide a signal 43 which correspondingly momentarily changes the frequency of the RF oscillator 32 until the RF signal is brought back into synchronisation with the laser pulses.

In another example, the frequency of the laser 2 may change due to an environmental effect (e.g. change of temperature). The output signal 43 of the PID changes the frequency of the RF oscillator 32 to match the frequency of the laser. In this circumstance, the frequency does not change momentarily and then return to the previous frequency (as with a phase correction). Instead the frequency stays at the new frequency.

As explained further above, it is desirable to minimise phase drift between laser pulses and resonantly enhanced EM fields in an RF cavity (e.g. a compression cavity and/or chopping cavity of a pump-probe system). The embodiment depicted in FIG. 1 reduces drift in a manner not disclosed in the prior art.

FIG. 2 schematically depicts the RF cavity 36. The RF cavity 36 comprises a generally cylindrical body 50 which is provided with a generally toroidal cavity 52. The generally cylindrical body 50 is conductive (e.g. formed from copper) and is connected to ground Coaxial cable 35 carries an amplified RF signal from the amplifier 34 (see FIG. 1). A high vacuum feedthrough 66 passes the RF signal to a drive antenna 63. The high vacuum feedthrough 66 may have an impedance of 50 Ohms. The drive antenna 63 may be a high power drive antenna. The drive antenna 63 excites an EM field in the RF cavity 36, which is resonantly enhanced by the RF cavity.

A central channel 58 extends along an axis which passes through the centre of the toroidal cavity 52. The channel includes a gap 60. In use, bunches of electrons travel along the central channel 58 and interact with the resonantly enhanced EM field in the RF cavity. The interaction occurs at the gap 60. The interaction between the resonantly enhanced EM field and the electrons modifies a velocity distribution of the electrons, thereby changing a spatial distribution of the electrons (e.g. compressing electron bunches or chopping an electron beam to form electron bunches).

The antenna 37 is located at one end of the toroidal cavity 52. The antenna 37 is connected via an angled SMA connector 62 to a coaxial cable 39a. A high vacuum feed-through 65 connects the coaxial cable 39a to a coaxial cable 39b, which is connected to the electro-optic modulator 30 (see FIG. 1). The coaxial cables 39a, 39b connected via the feedthrough 65 may be referred to as a single coaxial cable for ease of terminology. In other words, references in this document to a coaxial cable may encompass two coaxial cables which are connected together (e.g. via a feedthrough).

The antenna 37 is located in a bore 64 in the cylindrical body 50 which forms the toroidal cavity 52. The antenna 37 is an inner conductor of a coaxial waveguide, and the bore 64 is the outer conductor. The vacuum between the antenna 37 and the bore 64 acts as an insulator. The bore 64 may have a diameter which is chosen such that the microwave waveguide (comprising of antenna 37 and bore 64) has an impedance of 50 Ohms. The diameter of the bore 64 may for example be around 2.3 times the diameter of the antenna 37. The bore 64 may for example have a diameter of 2.88 mm (for an antenna having a diameter of 1.25 mm). The diameter of the bore 64 may be around 2.3× the diameter of the antenna 37 in order to provide an impedance of 50 Ohms.

A distal end of the antenna 37 projects into the toroidal cavity 52. The projection of the distal end may be small, for example, around 1 mm or less. In other embodiments the distal end of the antenna 37 may be flush with the toroidal cavity 52 (i.e. does not project into the toroidal cavity). The position of the distal end of the antenna 37 may be tuned in order to obtain a desired magnitude of RF signal for the opto-electric modulator 30. The size of the signal may be tuned during set-up of the system 1 by measuring the transmission from the beginning of coaxial cable 35 to the end of the coaxial cable 39 using a vector network analyser. Using a vector network analyser, a RF signal at the resonant frequency of the cavity may be applied to the beginning of coaxial cable 35, and the size of the signal transmitted to the end of the cable 39b may be measured. A transmission of (−30 dB) $\frac{1}{1000}$ may be measured, which means that when 50 W of power is supplied on coaxial cable 35, 50 mW of power will be received at the end of coaxial cable 39b. The transmission may be referred to as an S-parameter.

Figure 3:
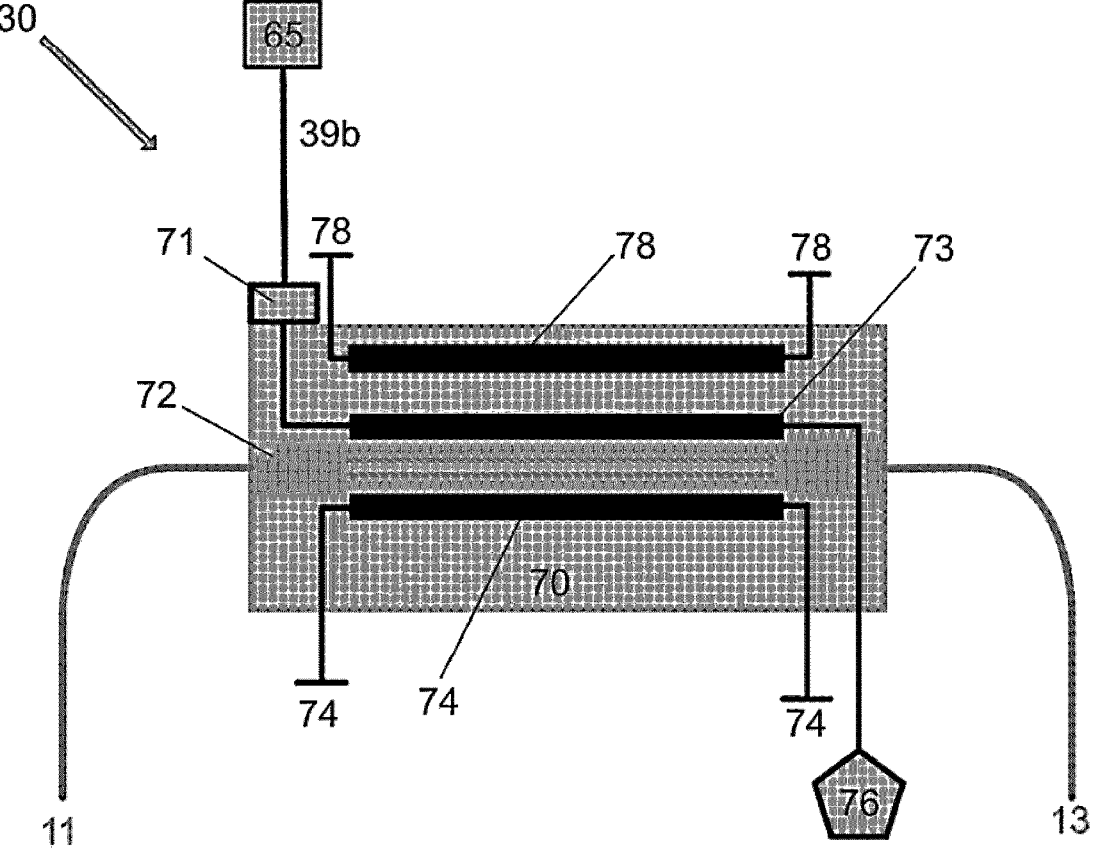
FIG. 3 schematically depicts an electro-optic modulator of the microwave synchronisation system of FIG. 1.

FIG. 3 schematically depicts the electro-optic phase modulator 30. The electro-optic phase modulator 30 comprises a substrate 70 which supports an optical waveguide 72. The waveguide 72 is formed from a birefringent material, for example lithium niobate. Electrodes 73, 74 are provided on the substrate 70 either side of the optical waveguide 72. The electrodes 73, 74 are configured such that when a voltage is applied across the electrodes this will establish an electric field which extends through the optical waveguide 72. The electric field will modify the refractive index of the lithium niobate 72 of the waveguide. The electro-optic phase modulator 30 may for example be a iXBlue NIR-MPX800-LN-05-00-P-P-FA-FA, available from iXBlue of Saint Germain en Laye, France. This is a 5 GHz phase modulator with polarization maintaining fibre which is optimized for around 800 nm light (which corresponds with the wavelength emitted by the Titanium-Sapphire laser). It has a low Vpi, meaning that the voltage necessary to achieve a TT phase shift is low (compared with other electro-optic phase modulators). Thus, the magnitude of signal received from the RF cavity 36 is sufficient to obtain a phase shift which can control the RF oscillator 32. If an Er-doped fibre laser operating at around 1500 nm were to be used, then an electro-optic phase modulator optimised for that wavelength may be used.

A first optical fibre 11 is connected to one end of the optical waveguide 72. This first optical fibre 11 is also depicted in FIG. 1, and extends from the 2×2 coupler 12 to the electro-optic phase modulator 30. A third optical fibre 13 extends from an opposite end of the waveguide 72. This third optical fibre is also depicted in FIG. 1, and connects the electro-optic modulator 30 to the quarter wave bias 16. In use, clockwise travelling laser light in the fibre Sagnac loop 14 is coupled from the second optical fibre 11 into the waveguide 72, passes along the optical waveguide and between the electrodes 73, 74 and then travels out through the third optical fibre 13. Anticlockwise travelling laser light travels through the optical fibres 11, 13 and the waveguide 72 in the opposite direction. Light travelling through the waveguide 72 is schematically indicated by arrows.

The antenna 37 is connected via coaxial cable 39a (see FIG. 2) to the vacuum side of feedthrough 65. This feed-through has two female SMA sockets. One end of coaxial cable 39b is connected to the air side of feedthrough 65 while the other end is connected to the SMA input 71 of the electro optical modulator. The SMA input 71 is connected to one end of electrode 73 of the electro-optic modulator 30. This electrode 73 may be referred to as a hot electrode 73.

An opposite end of the hot electrode 73 is connected to a terminator 76 which has an impedance of 50 Ohm. The terminator 76 ensures that an RF signal received at one end of the hot electrode 73 is not reflected back along the hot electrode after it has travelled along the length of the hot electrode. This is desirable, because back-reflection of the RF signal would generate a standing wave in the electro-optic modulator 30. Having the RF wave travel in one direction along the hot electrode 73 allows a fibre Sagnac loop 13 containing the electro-optic modulator 30 (see FIG. 1) to apply a phase shift to laser light circulating in one direction (the direction of travel of the RF wave) whilst applying no phase shift to laser light travelling in the opposite direction. The light to which no phase shift is applied advantageously provides a reference signal against which the phase shift can be measured.

The hot electrode 73 is located above the waveguide 72. Two electrodes 74, 78 which are connected to ground are provided on either side of the hot electrode 73. These may be equidistant from the hot electrode 73 to provide a symmetrical electromagnetic field when in use. The two electrodes 74, 78 may be referred to as cold electrodes. One of the cold electrodes 74 is located beneath the waveguide 72. The other cold electrode 78 is located above the hot electrode 73. Other configurations of electro-optic phase modulator may be used.

As noted further above, the RF signal at the electro-optic modulator 30 is received directly from the RF cavity 36 via the antenna 37, and as a result the output signal which is then used to control the RF oscillator 32 (see FIG. 1) is directly linked to the phase difference between the resonantly enhanced EM fields in the cavity 36 and the pulses of the laser beam 2 which pass through the electro-optic modulator 30. The phase of the resonantly enhanced EM field in the cavity 36 can thus be adjusted such that the EM field remains synchronized with pulses of the laser 2 even when phase drift of an RF component or of the repetition frequency of the laser changes. This may occur for example due to slowly varying thermal effects. Where this is the case, embodiments of the invention identify the change of (repetition rate) frequency of the laser pulses, or the phase drift of the RF component, and the frequency of the RF oscillator 32 is changed accordingly. Thus, the resonantly enhanced EM fields in the cavity 36 remain in phase with pulses of the laser, even when drift of the laser frequency or an phase drift by an RF component occurs.

In one example, of operation of an embodiment of the invention, the laser frequency is constant. The RF oscillator 32 generates an RF signal that travels via a coaxial cable 33 to the RF amplifier 34, and via a coaxial cable 35 to the RF cavity 36. The phase of the RF signal may change due to environmental effects in any of these RF components, including the RF cavity itself. The synchronization system of an embodiment of the invention will cancel the phase difference between the EM fields in the RF cavity and the laser pulses. In this context the EM fields are the RF signal that is provided to the cavity via the cable 35 which is resonantly enhanced by the RF cavity. All phase drifts that occur in the RF components 32, 33, 34, 35 and 36 will therefore be cancelled.

The antenna 37, and cables 39, may be configured such that sufficient power is extracted from the RF cavity 36 and provided to the electro-optic modulator 30 to generate substantial refractive index changes in the electro-optic modulator (e.g. large enough to apply a measurable phase shift to laser light travelling through the electro-optic modulator 30). This phase shift should be measurable by the balanced detector 22. The phase shift should to lead to a power distribution on the detector 22a and 22b that is able to generate an output voltage well above the noise floor. In one example, the RF cavity 36 may have an S-parameter S21 of −30 dB. The S21 parameter represents the power transferred from an input (feedthrough 66) to an output (feedthrough 65). S21=−30 dB is thus a measurement of the transmission from the input RF feedthrough 66 (which may be referred to as port 1) to the output RF feedthrough 65 (which may be referred to as port 2) of the RF cavity. This means that the picked up power is ¹⁄₁₀₀₀ (=10^(S21/10)) of the input power. As a result, when the RF cavity 36 is driven by 20 W on the input coaxial cable 35, then 20 mW is output by output coaxial cable 39. Thus, a 20 mW signal travels along the cable 39 to the electro-optic modulator 30. Power of the order of 10s of mW may be sufficient to drive the electro-optic modulator 30. The efficiency of the electro-optic modulator 30 is indicated by the half wave voltage VIT of the electro-optic phase modulator. It may be desirable for the VIT to be as low as possible (VTT is typically is a few Volts). The electro-optic modulator 30 in this embodiment has a impedance of 50 Ohms. Consequently, a 20 mW signal will result in the drive voltage of V=sqrt(50 Ohm*20 mW)=1V.

The fibre Sagnac loop is one example of an interferometer which may be used to determine a phase shift between a signal delivered to an electro-optic modulator and a pulsed laser beam. Other forms of figure Sagnac loop may be used, e.g. a fibre Sagnac loop which does not include a quarter wave bias in combination with a 2×2 coupler but instead includes a 3×3 coupler. When a 3×3 coupler is used the quarter wave bias 16 may be omitted. In other examples an electro-optic modulator may be provided in one arm of an interferometer with no electro-optic modulator provided in the other arm. The interferometer may have the form for example of a Mach-Zehnder interferometer, or may have some other form. Light may be coupled directly into an electro-optic modulator in free space (i.e. not via a fibre coupling).

In an alternative embodiment, instead of using a coaxial cable 39 to transfer the RF signal from an RF cavity to an electro-optic modulator, the electro-optic modulator may itself be located within the RF cavity. When this is done, the accuracy with which the resonantly enhanced EM fields in the RF cavity are synchronized with laser pulses travelling through the electro-optic modulator may be further enhanced. This is because the resonantly enhanced EM fields within the RF cavity are acting directly on the electro-optic modulator, and thus no potential loss of accuracy arising from a cable which connects the RF cavity to the electro-optic modulator can occur (the cable can induce an unwanted phase shift of the RF signal it carries).

Figure 4:
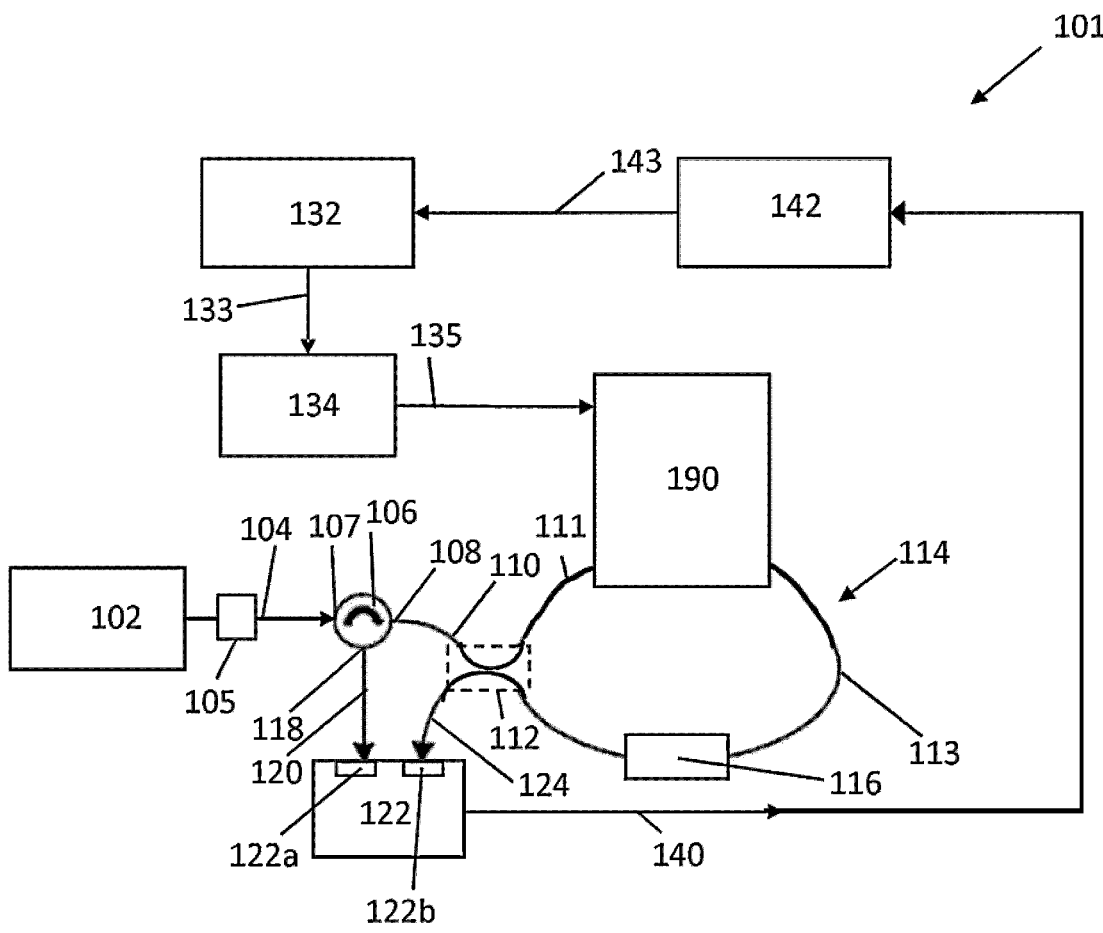
FIG. 4 schematically depicts a microwave synchronisation system according to an alternative embodiment of the invention.

FIG. 4 schematically depicts a microwave synchronization system 101 in accordance with an alternative embodiment of the invention. Most of the components of the system 101 correspond with those depicted in FIG. 1 and are described further above. In FIG. 4 these components have reference numerals which start with 100 (for example the laser 102 of FIG. 4 corresponds with the laser 2 of FIG. 1).

The microwave synchronization system 101 of FIG. 4 differs from the microwave synchronization system 1 of FIG. 1 in that the RF cavity apparatus 36 and electro-optic modulator 30 of FIG. 1 are not depicted as separate entities. Instead an RF cavity apparatus and electro-optic modulator combined as a single integrated system 190 is depicted. The integrated system 190, which may be referred to as a cavity-modulator system, is schematically depicted in detail in FIG. 5.

Figure 5:
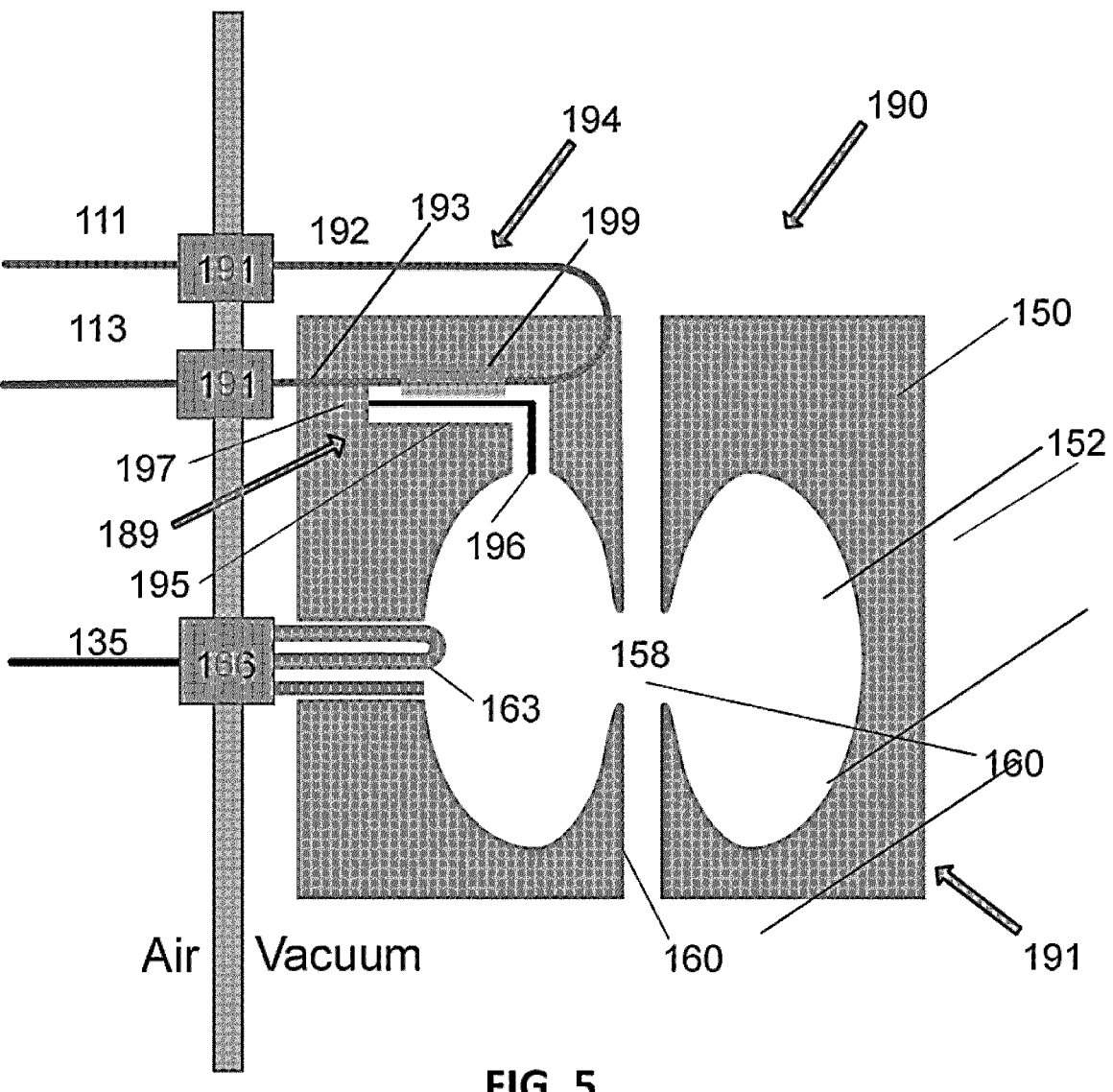
FIG. 5 is a schematic cross-sectional view of a cavity-modulator system which forms part of the microwave synchronisation system of FIG. 4.

Many of the components of the cavity-modulator system 190 depicted in FIG. 5 correspond with those depicted in FIG. 2. Features of FIG. 5 which correspond with features depicted in FIG. 2 are indicated with corresponding reference numbers but are incremented by 100. The cavity-modulator system 190 comprises an RF cavity apparatus 191 provided with an integrated electro-optic modulator 194. The RF cavity apparatus 191 comprises a generally cylindrical body 150 which is provided with a generally toroidal cavity 152. The generally cylindrical body 150 is conductive (e.g. formed from copper) and is connected to ground. A co-axial cable 135 carries an amplified RF signal through a feed through 166 to a drive antenna 163. The feed through 166 may have a impedance of 50 ohms. The drive antenna 163 may be a high power drive antenna. The drive antenna

163 excites a EM field in the generally toroidal cavity 152 of the RF cavity apparatus 191. The EM field is resonantly enhanced by the generally toroidal cavity 152.

A microwave waveguide 189 is formed in the generally cylindrical body 150 and connects with part of the generally toroidal cavity 152. The microwave waveguide 189 comprises a conductor 196 provided in a bore 195. The conductor 196 is an inner conductor of a coaxial waveguide, and the bore 195 is the outer conductor. The vacuum between the conductor 196 and the bore 195 acts as an insulator.

The conductor 196 extends to a location at which the bore 195 connects with the generally toroidal cavity 152. A distal end of the conductor 196 may project into the generally toroidal cavity 152, may be flush with the generally toroidal cavity, or may be recessed relative to the generally toroidal cavity. The position of the distal end may be selected to couple a desired strength of microwave signal from the generally toroidal cavity 152 into the microwave waveguide 189.

A proximal end of the microwave waveguide 189 is connected to a termination 197, which may also be referred to as a matched load 197. The termination 197 may have a impedance of 50 ohms. Similarly, the microwave waveguide may also have a impedance of 50 ohms.

In the depicted embodiment the bore 195 includes a 90° bend or corner. In other embodiments the bore 195 may be straight or may have some other configuration. The bore 195 is generally cylindrical in cross-section. However, the bore may have a different cross-sectional shape, and may have a different configuration.

An electro-optic modulator 194, which comprises a birefringent optical waveguide 199, is located in the bore 195 of the microwave waveguide 189. One side of the electro-optic 194 modulator is located adjacent to the conductor 196 of the microwave waveguide 189. An opposite side of the electro-optic modulator 194 may be located adjacent a wall of the bore 195 (and may be partially recessed into the bore). The electro-optic modulator 194 is located between the conductor 196 and a wall of the bore 195. As a result, an RF signal travelling along the waveguide 189 formed by the conductor and the bore will extend across the birefringent optical waveguide 199 of the electro-optic modulator 194.

The birefringent optical waveguide 199 has a construction which corresponds with part 72 of the electro-optic modulator 30 depicted in FIG. 3, and functions in the same manner. Optical fibres 111, 113 are connected to the optical waveguide 194 in the same manner as described further above in connection with FIG. 3. However, in this embodiment, a vacuum feed through 191 is used to feed each optical fibre 111, 113 from a non-vacuum side of the system to a vacuum side of the system 190 (the RF cavity apparatus 191 is held in a vacuum). The optical fibres 111, 113 pass through openings formed in the generally cylindrical body 150 to reach the birefringent optical waveguide 199.

During operation of the cavity-modulator system 190, the drive antenna 163 establishes a resonantly enhanced EM field in the generally toroidal cavity 152. A portion of the resonantly enhanced standing EM field is coupled to the microwave waveguide 189. A RF signal is generated which travels along the microwave waveguide 189. The travelling RF signal extends into the birefringent optical waveguide 199. The electric field causes a change of the refractive index of the birefringent material of the optical waveguide 199 the same manner as described further above in connection with the first embodiment.

As a result, a travelling wave refractive index change propagates along the optical waveguide 199. In FIG. 5 the travelling refractive index change travels from right to left, and thus travels in the same direction as laser pulses which are propagating around the fibre Sagnac loop 114 in the clockwise direction. Thus, as with the first embodiment, light which is propagating in the clockwise direction around the fibre Sagnac loop 114 experiences a refractive index change, whereas light which is travelling in the anti-clockwise direction does not experience a refractive index change.

A phase shift is generated which results in different powers being detected at photodetectors 122a, 122b of the balanced photodetector 122 (see FIG. 4). The balanced photodetector 122 provides an output signal which passes via loop electronics 142 to an RF oscillator 132. In this way the output of the RF oscillator 142 is set such that the EM field in the cavity 152 is synchronised to the laser 102 (in the same manner as described further above in connection with the first embodiment).

The termination 197 at the proximal end of the microwave waveguide absorbs the travelling RF signal and dissipates it. This prevents back-reflection of the RF signal. Such back-reflection is undesirable because it would generate a standing wave in the microwave waveguide which would prevent the system from functioning correctly (clockwise and anti-clockwise light would experience the same refractive index change).

The electromagnetic field in the microwave waveguide 189 is applied across the optical waveguide 199. The optical waveguide 199 is provided in this gap. In this case the body of the cavity is ground (cold electrodes of the electro-optic modulator are not required in this embodiment). The waveguide 189 may include a tapered portion.

The phase shift $\Delta\phi$ applied by the electrooptical effect in an optical waveguide is given by:

$$\Delta\phi = \frac{2\pi L}{\lambda}\Delta n_3 \tag{1}$$

With L the length of the optical wave guide, $\lambda$ the wavelength of the light passing the optical waveguide, $\Delta n_3$ the refractive index change, which for LiNbO3 is strongest in the crystallographic z-direction ($E_3$) and is given by $$\Delta n_3 = -\frac{1}{2}n_3^3 r_{33} E_3 \Gamma$$

Where $E_3$ is the electric field applied across the optical waveguide and $\Gamma$ a geometrical factor depending on design (lies between 0 and 1 and can for example be $\Gamma=0.65$). The electric field $$E_3 = \frac{V}{G}$$

can also be written as a voltage V applied across a gap G. For LiNbO3 the electrooptic coefficient $r_{33}=33$ pm/V and the refractive index $n_3=2.15$.

To apply a $\Delta\phi=\pm\pi/2$ phase shift $$\frac{VL}{G} = \mp\frac{\lambda}{2n_{33}^3 r_{33}\Gamma}$$

For LiNbO3 and λ=800 nm (in the case of a Titanium sapphire laser) this means that $$\left|\frac{VL}{G}\right| = 1876 \text{ Volt.}$$

The length of the optical waveguide, L, and the gap, G, between the conductor 196 and ground (i.e. the body 150) may obey the following relation: V*L/G=1876. For example, using voltage on the conductor 196 of V=2 Volts, the optical waveguide 199 may have a length to gap ratio (L/G) of 938. Using a gap of 50 um (=G) the optical waveguide should have a length of 4.7 cm (=L). Other combinations of voltage on conductor 196, gap width G and waveguide length L may be chosen, provided that the light that passes through the optical waveguide receives a phase shift that is measurable by the interferometer.

An advantage of the embodiment depicted in FIGS. 4 and 5 is that the optical waveguide 199 directly samples the resonantly enhanced EM field which is present in the toroidal cavity 152. That is, an antenna and cable configured to couple a microwave signal out of the vacuum environment and then to an electro-optic modulator is not required. Consequently, any phase noise or inaccuracy which would be caused by such a cable is avoided.

The embodiment of FIGS. 4 and 5 advantageously encodes the phase difference between the laser pulse and the EM field present in the RF cavity as sampled by the microwave waveguide 189 directly into an optical signal (i.e. without first carrying an RF signal out of the cylindrical body 150 of the generally toroidal cavity 192). Noise is generally avoided because the optical signal is less susceptible to noise (it has a frequency of 375 THz which is less prone to noise compared to lower frequencies that are conventionally used such GHz or MHz frequencies). In general, embodiments of the invention may use frequencies in the optical range (i.e. frequencies which correspond with wavelengths in the range 300 nm to 2000 nm)

Although a particular configuration of optical waveguide 199 within the RF cavity apparatus 190 is depicted, with the optical waveguide being held in a recess, other configurations may be used.

The laser 2, 102 may be a free-running laser. That is, the laser will oscillate at a natural frequency determined by the length of laser cavity. In the example mentioned further above the laser oscillates at a frequency of 75 MHz. As explained further above, the frequency of the laser may drift over time, and an embodiment of the invention may adjust the frequency of the RF signal used to drive the RF cavity apparatus 36, 190 to maintain synchronization between the resonantly enhanced EM fields and the laser pulses. Alternatively the laser may operate at a fixed frequency, and embodiments of the invention may compensate for drift of RF components (as explained further above). Embodiments of the invention may compensate for drift of both the laser and of RF components.

The RF cavity apparatus 36, 190 may have a bandwidth outside of which it does not effectively provide resonant enhancement of a RF signal. The cavity may for example have a resonance frequency of around 3 GHZ. The bandwidth of the resonance cavity may for example be 1 MHZ. As noted further above, the frequency of the laser (also referred to as a repetition rate) may be 3 GHZ/N (where N is an integer number). The frequency of the laser should not drift further than 1 MHz/N in this case. When N=40, the laser frequency should not drift more than 1 MHz/40, i.e. 25 kHz. If there is a risk that the laser frequency will drift further than 25 kHz, then the frequency of operation of the laser may be stabilized using a high stability RF synthesizer. In such an arrangement, a portion of the laser light is received by a second Sagnac interferometer based microwave synchronization system.

Other examples of stabilizing lasers exists but the one described above is the most accurate and is sold by companies like Cycle Lasers, of Hamburg, Germany, and Menlo Systems, of Munich, Germany.

Although embodiments of the invention depict a single microwave synchronization system with a single RF cavity apparatus, in other embodiments multiple microwave synchronization systems may be provided. In such embodiments a single laser may be used, with the beam from the laser being split between multiple RF cavities and associated systems. Referring for example to FIG. 1, everything depicted in FIG. 1 may be duplicated, with the exception of the laser 2, a single laser beam used to provide the laser beam which is used by both RF cavities (the same may apply in connection with FIG. 4).

Embodiments of the invention are advantageous because the phase difference between the laser pulses and the EM fields in the RF cavity 36 is encoded into an optical signal by the electro-optic modulator 30 (either directly in the embodiment of FIGS. 4 and 5 or via a cable in the embodiment of FIGS. 1 and 2). This is advantageous because once the signal has been converted into the optical domain it is less prone to noise (this is because the frequencies of the optical signals are in the range of a few hundred THz)

In the above described embodiments, the EM fields in a cavity are synchronized to laser pulses. The electron pulses are created by the laser pulses, and as a result they are intrinsically synchronized to the laser pulses. This means that the electron pulses are synchronized with the EM fields in the RF cavity. In order that a synchronized EM field can compress an electron pulse, the center of the electron pulse should pass through the center of the RF cavity exactly when the electric field has a zero crossing. Depending on the time of flight of the electron pulse from the cathode (where the electrons are created by the laser pulse) to the cavity, a fixed phase offset may need to be added between EM fields in the cavity and the electron pulses. This may be the case for example when the time of flight of the electron pulse to the EM cavity is not equal to N RF periods (N is an integer number). A fixed phase shift may be set to ensure that the laser pulses and the EM fields in the EM cavity a have a zero phase difference (to compensate for the effect of the electron time of flight to the EM cavity). One way in which this may be achieved is by adding an optical delay stage between the laser output and the interferometer input. The optical delay stage may for example be provided between the laser and the fibre collimator 5. The optical delay stage shifts the arrival time of the optical pulse in the electro-optic modulator. Operation of the system is then as described for the above embodiments. The optical delay stage should to be able to apply a delay of a minimum of one RF period (to allow compensation for any electron time of flight offset). For 3 GHz this corresponds with 333 ps, which is a 10 cm optical path. Optical delay stages with a 10 cm or more optical path are widely available.

Although embodiments of the invention comprise RF cavities with cylindrical bodies, in other embodiments the RF cavity may have a difference shape (e.g. rectangular cuboid). Similarly, the cavity of an RF cavity may have any suitable shape. Similarly, the bore within which the optical waveguide is incorporated may have any suitable shape.

The invention claimed is:

1. A microwave synchronisation system comprising:
an oscillator configured to provide a microwave signal, and an RF cavity configured to resonantly enhance the microwave signal to form a resonantly enhanced electromagnetic field;
an electro-optic modulator connected to the RF cavity and configured to receive a microwave signal from the RF cavity; and
an optical interferometer which includes the electro-optic modulator and is configured to provide an output indicative of a phase difference between a pulsed laser beam and the microwave signal received from the RF cavity; wherein
the output from the interferometer is connected to an input of the oscillator to provide feedback through which electromagnetic fields in the RF cavity can be synchronised with the pulsed laser beam.

2. The microwave synchronisation system of claim 1, wherein the electro-optic modulator is connected to the RF cavity by a microwave waveguide which opens into the RF cavity.

3. The microwave synchronisation system of claim 2, wherein the electro-optic modulator is provided in or adjacent to the microwave waveguide.

4. The microwave synchronisation system of claim 2, wherein a termination is provided at an end of the microwave waveguide which is opposite to the RF cavity.

5. The microwave synchronisation system of claim 2, wherein optical fibres are connected at opposite ends of the electro-optic modulator, and wherein the optical fibres pass through openings provided in a body of the RF cavity.

6. The microwave synchronisation system of claim 1, wherein the electro-optic modulator is connected to the RF cavity by a cable.

7. The microwave synchronisation system of claim 6, wherein the cable has a length of up to 50 cm.

8. The microwave synchronisation system of claim 6, further comprising insulting material provided around at least part of the cable.

9. The microwave synchronisation system of claim 1, wherein the optical interferometer is a fibre-Sagnac loop.

10. The microwave synchronisation system of claim 9, wherein the fibre-Sagnac loop includes a quarter-wave bias.

11. The microwave synchronisation system of claim 1, wherein the system further comprises a pulsed laser, and wherein an optical delay stage is located between the laser and an input of the optical interferometer.

12. A microwave synchronization comprising a pulsed laser and further comprising at least two systems according to claim 1, wherein each system includes optics configured to direct a pulsed laser beam from the pulsed laser to the at least two systems, and wherein each of the systems is configured to synchronise a resonantly enhanced electromagnetic field in that system to the pulsed laser beam.

13. A method of synchronising a resonantly enhanced electromagnetic field in an RF cavity with respect to a pulsed laser beam, the method comprising:
using an oscillator to generate a microwave signal which is amplified then resonantly enhanced by an RF cavity to form a standing wave;
directing a microwave signal from the RF cavity to an electro-optic modulator;
using an optical interferometer which includes the electro-optic modulator to determine a phase difference between the pulsed laser beam and the microwave signal received from the RF cavity; and
using an output from the interferometer to control operation of the oscillator and thereby synchronise the resonantly enhanced electromagnetic field in the RF cavity with respect to the pulsed laser beam.

14. The method of claim 13, wherein the RF signal is directed from the RF cavity to the electro-optic modulator by a microwave waveguide.

15. The method of claim 13, wherein the RF signal is directed from the RF cavity to the electro-optic modulator by a cable.

* * * * *